(12) United States Patent
    Cohen et al.

(10) Patent No.: US 10,216,098 B2
(45) Date of Patent: Feb. 26, 2019

(54) TEST STRUCTURE FOR USE IN METROLOGY MEASUREMENTS OF PATTERNS

(71) Applicant: NOVA MEASURING INSTRUMENTS LTD., Rehovot (IL)

(72) Inventors: Oded Cohen, Gedera (IL); Gilad Barak, Rehovot (IL); Igor Turovets, Moshav Givat Yarim (IL)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 64 days.

(21) Appl. No.: 15/534,187

(22) PCT Filed: Dec. 10, 2015

(86) PCT No.: PCT/IB2015/059523
§ 371 (c)(1),
(2) Date: Jun. 8, 2017

(87) PCT Pub. No.: WO2016/092506
PCT Pub. Date: Jun. 16, 2016

(65) Prior Publication Data
US 2017/0363970 A1    Dec. 21, 2017

Related U.S. Application Data

(60) Provisional application No. 62/089,875, filed on Dec. 10, 2014.

(51) Int. Cl.
*G03F 7/20* (2006.01)
*H01L 21/66* (2006.01)

(52) U.S. Cl.
CPC ...... *G03F 7/70625* (2013.01); *G03F 7/70466* (2013.01); *G03F 7/70683* (2013.01); *H01L 22/30* (2013.01); *H01L 22/34* (2013.01)

(58) Field of Classification Search
CPC ............ G03F 7/70625; G03F 7/70466; G03F 7/70683; H01L 22/30; H01L 22/34
USPC .............................................. 430/30; 257/48
See application file for complete search history.

(56) References Cited

U.S. PATENT DOCUMENTS

| | | | |
|---|---|---|---|
| 6,657,736 B1 | 12/2003 | Finarov et al. | |
| 2003/0232454 A1 | 12/2003 | Bischoff et al. | |
| 2005/0168716 A1 | 8/2005 | Ausschnitt | |
| 2009/0193367 A1 | 7/2009 | Deppe et al. | |

FOREIGN PATENT DOCUMENTS

| | | | |
|---|---|---|---|
| WO | 20130134487 A1 | 9/2013 | |
| WO | 2014193983 A1 | 12/2014 | |
| WO | 2015193904 A1 | 12/2015 | |
| WO | 2016020925 A1 | 2/2016 | |

*Primary Examiner* — Christopher G Young
(74) *Attorney, Agent, or Firm* — Browdy and Neimark, PLLC

(57) ABSTRACT

A test structure and method of its manufacture are presented for use in metrology measurements of a sample pattern. The test structure comprises a test pattern comprising a portion of the sample pattern including at least one selected feature and a blocking layer at least partially covering regions of the test structure adjacent to the at least one selected region.

18 Claims, 10 Drawing Sheets

TEST STRUCTURE FOR USE IN METROLOGY MEASUREMENTS OF PATTERNS

TECHNOLOGICAL FIELD

The present invention is generally in the field of metrology measurements of patterns, such as microelectronic devices, and relates to a test structure design for facilitating metrology measurements of complex patterns.

BACKGROUND

Microelectronic devices are widely used and are becoming smaller in dimensions, as well as more complex. Manufacturing of such microelectronic devices requires process control using inspection and metrology applied to patterns on substrates (e.g. wafer substrates), as well as identify defects in such patterns. Generally, the structure's properties (geometry and material composition) can be determined by analyzing the optical response of the structure at different wavelengths, different polarization states and/or different directions.

Accurate characterization of the geometrical and material properties of microelectronic devices becomes increasingly challenging, as the critical dimensions become ever smaller and the patterns become more complex. Optical scatterometry (including spectral reflectometry and spectral ellipsometry, etc.) is an extremely effective method for obtaining information on the geometry and material properties of such structures. In this method, broadband light is shone on a sample and collected after being returned from it. By analyzing the returned light of different wavelengths and polarization components of the incident light, incident at different directions, it is possible to obtain information about the structure/sample. Commonly, optical scatterometry is applied to test structures comprised of a repeating array of identical elements, e.g. grating.

Metrology is commonly used to identify specific attributes of the measured structure, such as geometric parameters or material characteristics, and typically utilize spectral measurements. The accuracy by which these parameters can be measured is directly determined by their effect on the measured spectra.

All multiple patterning applications (involving pitch splitting/division) create arrays of lines-and-spaces with overlay appearance as a difference between lines and spaces that are located at the same level (same material and same layer), actually creating multiple critical dimensions (CDs) per period. Such multiple patterning applications include the Litho-Etch-Litho-Etch (LELE) technique, and the Spacer Assisted Double Patterning (SADP) technique. Double Patterning (DP) can create a line CD and two different space CDs for SADP, and up to four different CDs for case of LELE.

GENERAL DESCRIPTION

There is a need in the art for optimizing the metrology measurements in a complex patterned sample, requiring measurements of all the CDs for the Advanced Process Control (APC).

As indicated above, double patterning techniques, such as LELE and SADP techniques can create pattern features (lines/spaces) of several different dimensions. In this connection, reference is made to FIGS. 1A-1F and FIGS. 2A-2F illustrating the principles of, respectively, the LELE technique and the SADP technique exemplifying pitch division methods.

Figures 1A, 1B, 1C, 1D, 1E, 1F:
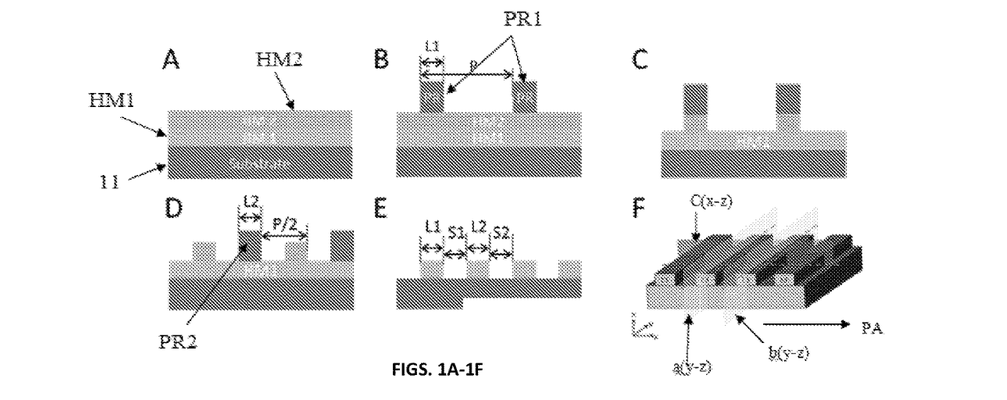
FIGS. 1A-1F schematically illustrate the principles of the Litho-Etch-Litho-Etch (LELE) technique exemplifying a pitch division method.

In order to achieve ½ pitch (½P) of the lithography printing pitch capability, the following sequence is typically used. As shown in FIG. 1A, two hard-mask layers, a first layer $HM_1$ and a second layer $HM_2$, are deposited on a substrate 11 with distinctive etch selectivity. After that, as shown in FIG. 1B, photolithography printing step $PR_1$ is performed for printing of lines with width $L_1$ of ¼P and Space of ¾P between them. In the third step, exemplified in FIG. 1C, selective chemical etching is applied to the pattern through the mask layer $HM_2$, while the mask layer $HM_1$ is intact due to its resilience to the chemistry used for removing parts of the layer $HM_2$. Second photolithography printing $PR_2$ is then performed being intended to create lines with the same width $L_1$ as the first printing, but with their centers offset by ½P with respect to the first lines center, as shown in FIG. 1D. A second selective etch step is performed, as shown in FIG. 1E, resulting in the main pattern $P_{main}$ formed by alternating lines L of $HM_1$ and grooves/spaces S between them.

Two main error types can occur during the LELE process: First, photolithography print-to-print tool instability, such as exposure dose or focus, may cause a difference between the critical dimensions (CD), widths, of alternating lines (i.e., $L_1 \neq L_2$, FIG. 1E). In addition, any overlay error between the two lithography steps will introduce an offset between alternating grooves (i.e., $S_1 \neq S_2$, FIG. 1E).

Figures 2A, 2B, 2C, 2D, 2E, 2F:
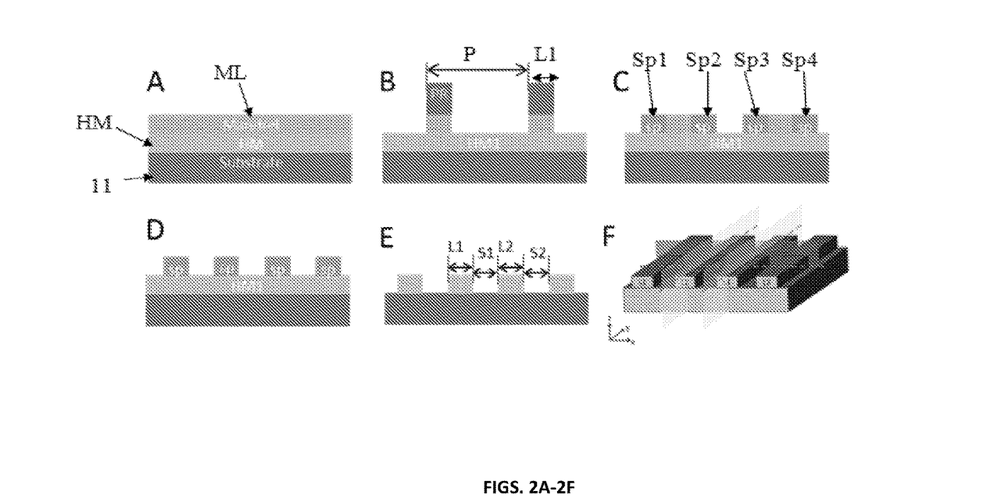
FIGS. 2A-2F schematically illustrate the principles of the Spacer Assisted Double Patterning (SADP) technique as another example of the pitch division method.

In the SADP pitch division method, similarly to LELE technique, this scheme achieves a grating with half the lithography pitch, ½P, and involves the following steps. The first step, shown in FIG. 2A, involves deposition of two layers, a hard-mask layer HM, and a mandrel layer ML on top of a substrate 11. In the second step, photolithography printing step PR is performed for printing of mandrel lines with the pattern pitch P and width $L_1$ equal to the width of intended groove/space S, as shown in FIG. 2B. Generally, the first mask patterns the array core by defining the spacers, while a second mask is used to crop or trim the spacers to form individual lines. Photoresist removal is followed by deposition of thin film spacers, such that spacer blanket etch forms two pillars, $Sp_{1-2}$ and $Sp_{3-4}$, on the sides of each line etched in the mandrel layer ML, as shown in FIG. 2C. The mandrel layer/pattern ML is then removed, as shown in FIG. 2D, and the spacers $Sp_{1-4}$ and the HM layer are resilient to the etch chemistry used in this step. In the following step, the HM layer is etched. As a result, the main pattern $P_{main}$ is formed including lines L of HM layer and spaces S between them (at the places of the removed mandrel lines and in the gap(s) between the spacer pillars), as FIG. 2E shows.

Contrary to LELE, in SADP the CDs (widths) of the lines are usually matched (i.e., L1=L2, FIG. 2E). However, as soon as the mandrel width equals the gap between adjacent spacers, the space S width will fluctuate around the intended relation S1=S2. Such deviation can arise from mandrel photolithography step instability (such as exposure energy, focusing) and mandrel etch bias fluctuations.

The LELE, as well as SADP pitch division scheme, may be generalized to three-pitch division (Spacer Assisted Triple Patterning) by adding photolithography and etch cycles (in LELE) or multiple spacer deposition and blanket etch and removal cycles with appropriate removal etching chemistry (in SADP).

More advanced patterning schemes, such as Quadra Patterning (QP), are becoming leading candidates for the future advances process technology nodes of 5-7 nm. For example, the Spacer Assisted Quadra Patterning (SAQP) process may be obtained based on the above-described SADP and the use of the spacer pillar as the mandrel of the next cycle, yielding Quadruple and 8 fold patterning. In such method, multiple process steps create the final structure, and all the steps influence the final result.

Several techniques have been developed for optimizing the metrology measurements in a complex patterned sample. These techniques are described in PCT/IL2015/050807 and PCT/IL2015/050625, both assigned to the assignee of the present application. These techniques are based on test structures including a test pattern formed by a main pattern corresponding to the pattern of the sample, and one or more intentionally provided auxiliary patterns, where auxiliary features are associated with at least some of the features of the main pattern. This approach enables to increase sensitivity of optical measurements to a change in parameters of interest, for example by identifying "asymmetry" or "symmetry" condition of the test pattern parameters with respect to a predetermined symmetry plane or point.

The present invention provides a novel test structure design for use in metrology measurements of complex patterns (e.g. having small features) produced by pitch division multi-patterning process. According to the invention, the test structure comprises a test pattern based on "split" of the complicated sample pattern into multiple "simple" patterns. The test pattern comprises a part of the sample pattern (one or more unit cells, preferably at least two unit cells) modified by a block/cut layer (either continuous or formed by spaced-apart lick/cut elements), such that some of the features of the sample pattern are at least partially covered/removed by the block/cut layer. The test pattern is manufactured together with the sample to be measured, and is designed in accordance with the multi-patterning process used to manufacture the sample and in accordance with pattern feature(s) of the sample to be controlled (i.e. on which the control process is being focused).

This technique provides for modeless measurements of pitch walking effect, based on calibration. "Pitch walking" results from the fact that the entire sample pattern is formed by two or more arrays (sub-patterns) of features created using sequential patterning stages, and should be controlled during the sample manufacture. Model-based measurements can also be used, by applying special algorithms and interpretation sequence to allow fast and accurate interpretation of multiple CD and Space parameters (together with all other required parameters).

Thus, according to one broad aspect of the invention, there is provided a method for creating a test structure for use in metrology measurements of a sample pattern produced by a predetermined multi-patterning scheme. The method comprises: applying a multi-patterning process to a test site for creating a test pattern based on design rules of the sample pattern and configured to enable focusing the metrology measurements on at least one selected feature of the sample pattern. The multi-patterning process applied to the test site either comprises said multi-patterning scheme and at least one additional patterning stage or comprises said multi-patterning scheme while modifying at least one patterning stage of said multi-patterning scheme, such that the multi-patterning process creates in the test site a part of the sample pattern and at least one blocking layer at least partially blocking features of the sample pattern adjacent to said at least one selected feature.

In some embodiments, the at least one blocking layer comprises a continuous layer within a region between a pair of the selected features.

In some embodiments, the at least one blocking layer comprises blocking elements arranged in a spaced-apart regions along the at least one selected feature.

The creation of the at least one blocking layer may comprise applying material deposition to at least one region of the test structure; or applying material removal to at least one region of the test structure.

The multi-patterning process applied to the test site may be configured to modify a complex structure of the sample pattern, with respect to the at least one selected feature, into the test pattern having a simpler structure with respect to said at least one selected feature.

In some embodiments, the test structure resulting from the multi-patterning process comprises an array of at least two spaced patterned regions, each being a portion of the unit cell of the sample pattern including, at least partially, said at least one selected feature.

In some embodiments, the method also comprises determining the multi-patterning process to be applied to the test site. This includes processing and analyzing input data comprising: data indicative of the rule design of the sample pattern, data indicative of the multi-patterning scheme, and data indicative of said at least one selected feature on which the metrology measurements are to be focused.

In some embodiments, the multi-patterning process applied to the test site is further configured to induce a known parameter difference between the selected features in the test pattern, thereby enabling self-calibration of metrology measurements.

The multi-patterning process may be applied to the test site concurrently with applying the multi-patterning scheme to a pattern region of the sample to create the sample pattern in the pattern region.

The test site may be located in a test region of the sample outside the pattern region; or may be located in a test region of the sample within a scribe line of the pattern region.

Typically, the unit cell of the sample pattern comprises an array of alternating lines and spaces.

The method of the invention may be aimed at controlling the multi-patterning scheme including at least one of Litho-Etch-Litho-Etch (LELE) scheme, Spacer Assisted Double Patterning (SADP) scheme, and Spacer Assisted Quadra Patterning (SAQP) scheme.

According to another broad aspect of the invention, there is provided a test structure for use in optical metrology measurements of a sample pattern, the test structure comprising a test pattern comprising a portion of the sample pattern including at least one selected feature of the sample pattern and a blocking layer at least partially covering regions of the test structure adjacent to said at least one selected region.

The features of the sample pattern may be partially or totally blocked/replaced, providing a modified arrangement of the features of interest in the test pattern with respect to an optical measurement scheme. The sample patterned features may be fully blocked, i.e. by a structure that is solid like and not patterned, forming "modified" patterned structure.

The technique of the invention does not need any modification in the measurement hardware, and various existing measurement techniques can be used. All raw measured data can be obtained by using Normal-Incidence Reflectometry (NI-R), as well as any other multi-angle and/or multi azimuth spectral and/or angular reflectometric and scatterometric and/or ellipsometric tools or any combinations of these tools.

BRIEF DESCRIPTION OF THE DRAWINGS

In order to better understand the subject matter that is disclosed herein and to exemplify how it may be carried out in practice, embodiments will now be described, by way of non-limiting examples only, with reference to the accompanying drawings, in which.

DETAILED DESCRIPTION OF EMBODIMENTS

FIGS. 1A-1F and 2A-2F schematically illustrate the principles of the LELE and SADP techniques exemplifying pitch division methods.

Measurement of multiple CDs per period is challenging due to a large number of parameters, low sensitive to minor CD differences, and due to correlation between different CDs for all optical techniques, including Normal-Incidence Reflectometry (NI-R) as well as any other multi angle and/or multi azimuth spectral and/or angular reflectometric and scatterometric and/or ellipsometric tools or any combinations of these tools.

Figure 3A:
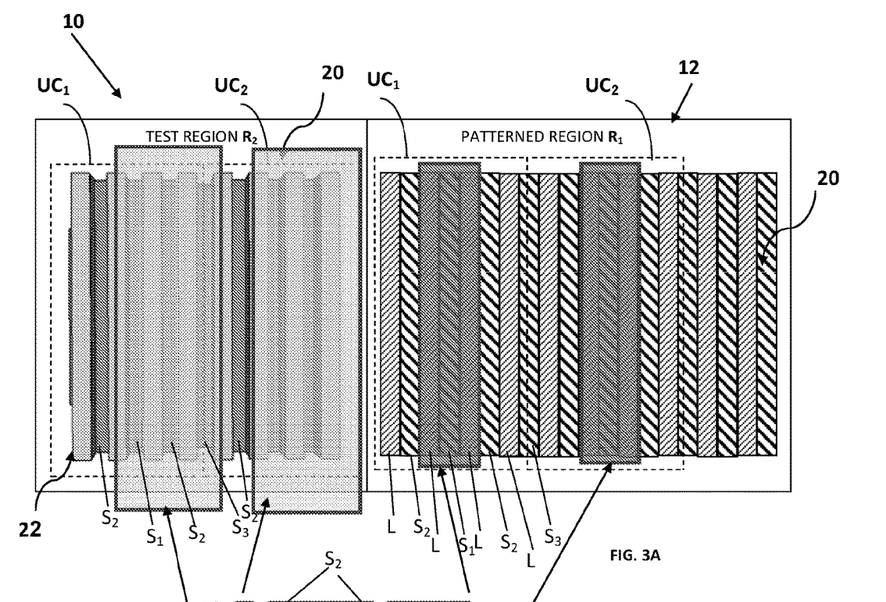
FIG. 3A is a schematic illustration of an example of a test structure associated with a sample pattern to be measured.
Figure 3B:
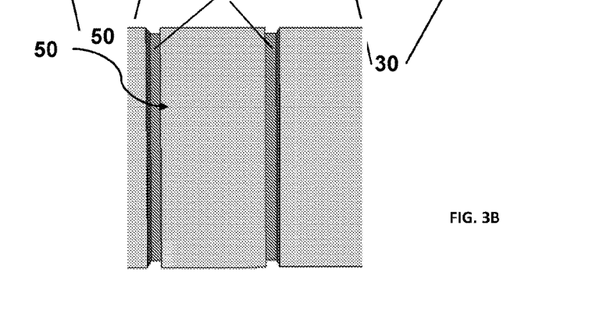
FIG. 3B illustrates a specific example of a test structure design.

Reference is made to FIGS. 3A and 3B schematically illustrating the principles of the present invention. FIG. 3A shows a portion of an exemplary test structure 10, which is associated with a patterned sample 12 to be measured (e.g. to control the patterning process). In this example, the test structure 10 is integral with the sample, and could be located in a test region thereof (usually on scribe lines). More specifically, the sample has a patterned region $R_1$ (constituting a real patterned structure) in which a pattern 20 (to be controlled) is formed, and a test region $R_2$ in which a test structure 10 is located. The sample pattern typically includes a periodicity of unit cells along a pattern axis, where each unit cell includes a pattern of spaced-apart regions of different optical properties (e.g. lines and spaces).

It should be understood that the figure is very schematic (e.g. the test site and sample pattern region may not be adjacent), and is not in scale, in order to facilitate illustration and explanation. The figures actually show a small fraction of the sample pattern, as well as a small fraction of the test region.

In this specific non limiting example, the test structure 10 is configured for controlling the patterning process utilizing a SAQP scheme. This scheme creates a unit cell formed by four lines L and spaces $S_1$, $S_2$ and $S_3$ per the original Litho period. Two litho core periods/unit cells $UC_1$ and $UC_2$ are presented in the figure. Here, space $S_1$ originates from the Core litho line L center; space $S_2$ is the trench defined by the first spacer width, and $S_3$ is the trench aligned with space center of Core litho. Cores' litho line L original locations on the sample are shown as transparent layers 30. For the SAQP scheme, four CDs (CD of line L and CDs of three spaces $S_1$, $S_2$ and $S_3$) are to be measured.

As shown in the figure, the test structure 10 includes a test pattern in the form of modified unit cells of the sample pattern 20—two such unit cells are used in the test structure exemplified in the figure. The sample pattern modification is aimed at splitting a complex sample pattern into relatively simple patterns, in which some of one type features of the sample pattern are replaced by the other type features, thereby creating a modified unit cell of the sample pattern features. This is achieved by blocking a part of the sample pattern features in the test structure, i.e. applying a so-called "block mask" 50. The use of such a block mask 30 results in modifying the complex sample pattern 20 in the test structure 10 into one or more "simple" patterns. Such modification may, for example, be aimed substituting the complex pattern by at least one "simple" pattern that includes at least one or more features of the complex pattern spaced by a relatively wide blocked/cut continuous (unpatterned) region (within one unit cell), in some cases the modification could cause increasing a periodicity of the appearance of a selected feature of the sample pattern (by corresponding blocking features belonging to different unit cells). In some other embodiments, the modification may be such as to block/cut all the pattern features of the sample pattern except for a predetermined feature(s), e.g. choosing one predetermined space from 4 spaces by blocking the other 3 spaces, and measuring of the predetermined non-blocked space. This technique allows for choosing which part of the sample pattern is to be blocked in the test structure, and accordingly the feature (line(s) or space(s)) under measurement is known.

The process flow that is used for multiple patterning includes multiple block and/or cut lithography steps required to trim the grating to the required by design pattern. According to the invention, these additional lithography steps, while being applied to the patterned region $R_1$ to create a sample pattern in that region, may be used to modify the complicated sample pattern in the test structure 10 into at least one "simple" pattern enabling measurement of pattern parameter(s) of interest (i.e. direct measurement, or calculation via model-based or modeless processing of the optical response of the test structure).

FIG. 3A illustrates an example of the configuration of the test structure 10 comprising a test pattern 22 formed by at least two unit cells $UC_1$ and $UC_2$ of the sample pattern 20 and a block mask/layer 50 on top of a part of the sample pattern 20. In this specific non-limiting example, the block mask 50 includes two spaced-apart features, each being located above a region of the sample pattern 20.

It should be noted that such a mask (printed layer of a single or at least two spaced-apart features), covering a part of the complex sample pattern in the test structure, is referred to herein below as a "block mask" or a "cut mask". This is because deposition of a blocking layer/mask in a preceding material deposition step of the patterning process results in removal/cutting of material in a successive etch step of the patterning process.

In some embodiments, the block mask 50 is configured for masking almost all or all the features of the sample pattern (e.g. all spaces) except for one chosen feature (e.g. space $S_2$) which dimension is to be controlled, as exemplified in FIG. 3A. FIG. 3B shows more specifically part of the test structure with the block mask 50 thereon. In these examples, the block mask design 50 is aimed at/focused on the space $S_2$.

Generally, the block or cut mask may be used for complete screening/blocking of the part of the "complex" sample pattern allowing direct measurements of the unscreened part, or any partial screening of any part of the complex sample pattern, that allows to better distinguish between the parts/features, improving sensitivity and reducing correlations.

Figure 4A:
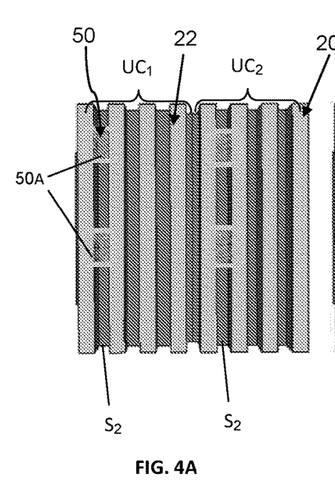
FIGS. 4A to 4C illustrate three more examples, respectively, of a test structure of the invention.
Figure 4B:
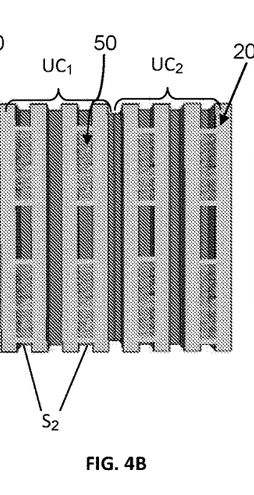
Figure 4C:
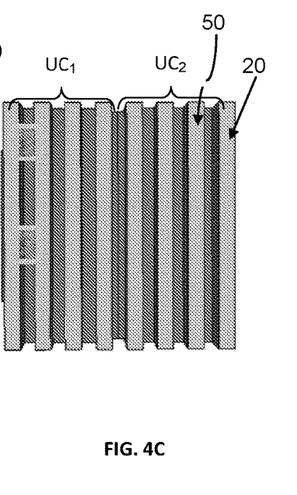

Reference is made to FIGS. 4A-4C showing three more examples of the test structures with (partially) block masks. To facilitate understanding, the same reference numbers are used for identifying functionally common features of all the examples.

The specific non-limiting examples of FIGS. 4A-4C are focused on the space feature $S_2$, and demonstrate the embodiment of partial screening/blocking of the complex sample pattern in the test structure. In the example of FIG. 4A, single space $S_2$ is partially blocked per period (unit cell) by features 50A of the block mask 50. In the example of FIG. 4B, both spaces $S_2$ of each unit cell are partially blocked by features 50A. In the example of FIG. 4C, single space $S_2$ is blocked in the selected unit cell(s) of the test pattern.

These examples illustrate multiple possibilities of the block mask configuration aimed at "focusing" on the single pattern feature of the unit cell (period), multiple features of the unit cell, single and/or multiple features of chosen one or more unit cells, etc. For example, the pattern feature(s) to be focused on (by properly modifying (e.g. "splitting") the complex sample pattern into simple pattern(s)) may include the spaces defined by the SAQP process, such as the space originated from the Core litho line center (space $S_1$), trench defined by the first spacer width (space $S_2$), trench aligned with space center of Core litho (space $S_3$), etc.

Such a technique of blocking a part of the complex sample pattern for "focusing" of chosen feature(s) of the pattern can be used for patterned structure (a simple repetitive line/space array). The measured optical signal has information only about the chosen non-blocked feature (e.g. space $S_2$), and practically does not bear any information about the blocked features (e.g. line CD, and spaces $S_1$ and $S_3$). Such a test structure is also suitable for process control of $S_2$ space, because $S_2$ space is created by the standard Quadra Patterning process flow through all the steps including the hardmask etch, and only the last step (final etch) is done for a modified (blocked) structure.

It should be understood that similar "focusing" structures can be prepared also for spaces $S_1$ and $S_3$. Direct measurements of the "focusing" structures by optical methods can allow direct and accurate control of all different spaces produced by SAQP.

In the above examples of the "focusing" structures (SAQP examples of FIGS. 3A and 3B) all the profile parameters (all layer thickness, materials, etc) are the same, except for parameters related to the selected feature, generally feature (space) $S_x$ for "focusing" the measurements on the two spaced sites/structures "$S_x$". As a result, detected signals/signatures difference between two "focusing" structures is proportional to the differences between the spaces $S_x$ in the two sites and not sensitive to other parameters of the profile. So, by measuring signals/signatures difference, the space difference can be directly measured with the help of calibration data, without the need for modeling.

Figure 5:
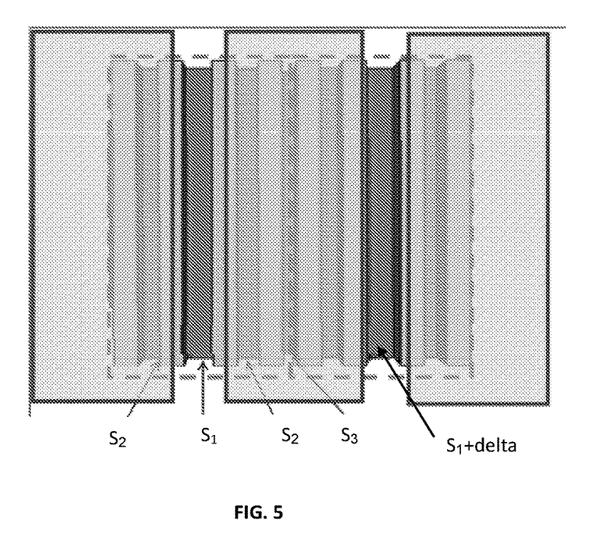
FIG. 5 exemplifies test structure configured to enable a self-calibration measurements scheme.

The same principles can be used to create a self-calibration scheme. This is exemplified in FIG. 5. As shown, for the calibration purpose, an additional site "S1+delta" is formed in the test structure with a predefined space offset (delta). The easiest way to define the space offset is to do Core CD offset that will be translated into $S_1$ offset. This known offset can be used to calibrate spectral/pupil difference to the difference in CD. This calibration can be optionally performed before each measurement, or once per die/wafer/product based on the process variability and/or customer needs.

Figure 6:
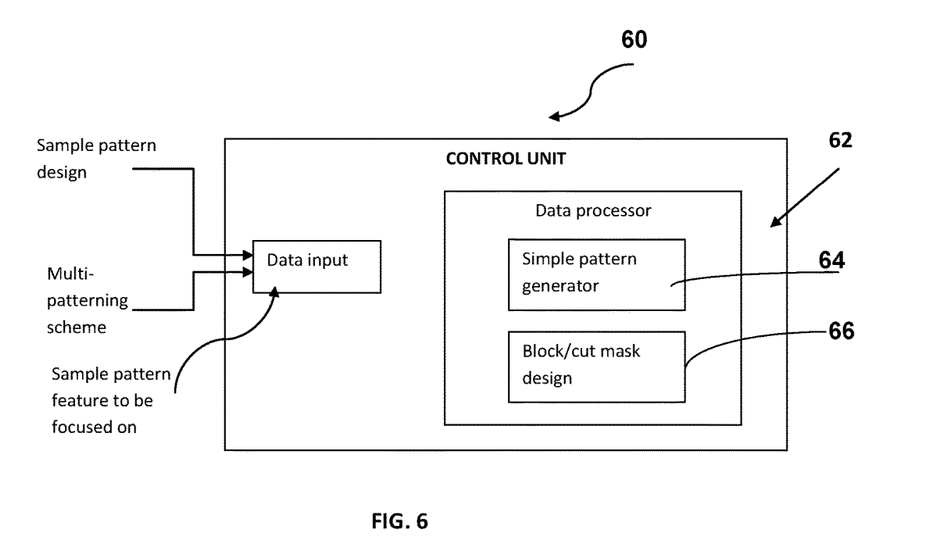
FIG. 6 is a block diagram of a system for designing a block/cut mask for use in the manufacture of the test structure.

Reference is made to FIG. 6 showing a block diagram of a system 60 for managing the test structure manufacture. Such management system 60 is typically a computer system which includes inter alia a data processor 62 preprogrammed for receiving and processing input data indicative of the sample pattern design (20 in FIG. 3A), data indicative of the multi-patterning scheme (LELE, SADP, etc.), and data indicative of the sample pattern feature(s) to be focused on. The data processor 62 includes a simple pattern generator 64 which is adapted for analyzing the input data and generating data indicative of a suitable/optimal modified unit cell corresponding to a simple pattern enabling measurements (using model or modeless approach) of the "focused" sample pattern feature(s). This modified unit cell data is then processed by a mask design module 66 to generate data indicative of an optimal block/cut mask to be applied to/created in the test structure.

For example, the process for creating a test structure suitable for modeless measurement approach can be as follows: During the creation of a "complex" structure by a standard multi patterning sequence, block or cut layers/masks can be used to modify the "complex" multi parameters structure and into "simplified" structures that concentrate sensitivity of certain target elements/parameters. The target parameters of the "simplified" structures are as similar as possible to the same elements of the target structure. All other profile parameters, such as layer thicknesses and under layers, are the same for all simplified structures and (can be) similar to the "complex" structure. The number of simplified structures (one or more) is defined by the task complexity and metrology requirements. In addition, at least one of the "simplified" structures may be created with the predefined offset to allow self-calibration per die/wafer/product.

All the sites comprising "simplified" structures may be measured by optical techniques (standard measurements). Optionally, two sites comprising "simplified" structures with predefined offset are measured for self-calibration. Signals/signatures (e.g. spectral, etc.) difference is then calculated. The self-calibration creates correlation between the signal difference and exact known offset at the current die/wafer/product, improving accuracy. The signal differences between the sites comprising "simplified" structures can be calculated. Then, based on the calibration, a difference between the target parameters on the sites is calculated.

The following is an example of the model-based target structure measurement: The modeling of entire "complex" structure (unit cell) can be performed, and interpretation of signal measurements of all or part of the sites comprising "simplified" structures can be done together with the measurements of the site comprising the entire "complex" structure in order to measure all the required parameters. In this scheme, special algorithm and interpretation sequence for data processing is used, to allow fast and accurate interpretation (based on spectral and/or pupil and/or Ellipsometry measurement and/or other existing OCD methods). One of possible ways to use special algorithm and interpretation sequence is as follows: one model is created for all the measurement sites (comprising complex and simplified structures), and all corresponding parameters of "complex" and "focusing" sites are defined as global parameters to reduce the total number of floated parameters. Generally speaking, additional measurements sensitive to the target parameters are obtained, without increasing of overall number of floated parameters ("multi stack").

Thus, the present invention provides a novel test structure design facilitating metrology measurements in complex patterns produced by pitch division multi-patterning processes. The test structure includes a test pattern formed by one or more of the unit cells of the sample pattern and a block layer at least partially masking some of the features in the at least one unit cell of the test pattern. It should be understood that the invention is neither limited to the control of multi-stage patterning process nor to any specific arrangement of features of the sample pattern.

It should also be understood that the test structure 10 (e.g. located in the test region $R_2$ of the sample) undergoes the same patterning process as the sample (patterned region $R_1$ of the sample). Accordingly, the arrangement of features of the unit cell(s) in the test pattern is the same as in the sample pattern in patterned region $R_1$ of the sample, while the block layer is being intentionally created in the test structure (only in the test region $R_2$) during the manufacture of the patterned region $R_1$ of the sample.

The configuration of the block layer/mask (i.e. arrangement of features of the block mask with respect to the sample pattern in the test structure) is such that, when applying optical measurements to the test structure using a predetermined optical measurement scheme, an optical response of the test structure is indicative of the parameter(s) of interest of the sample pattern. More specifically, a change in the lateral dimension of the pattern feature of interest (e.g. unscreened feature) from a nominal value affects a change in the optical response of the test structure from certain nominal/reference signature. This change is mainly associated and is thus indicative (mainly) of a change in one or more parameters of interest of the sample pattern from nominal value(s) thereof. This is because one could choose where to put the block layer, and accordingly could know which feature changes and how).

Figure 7:
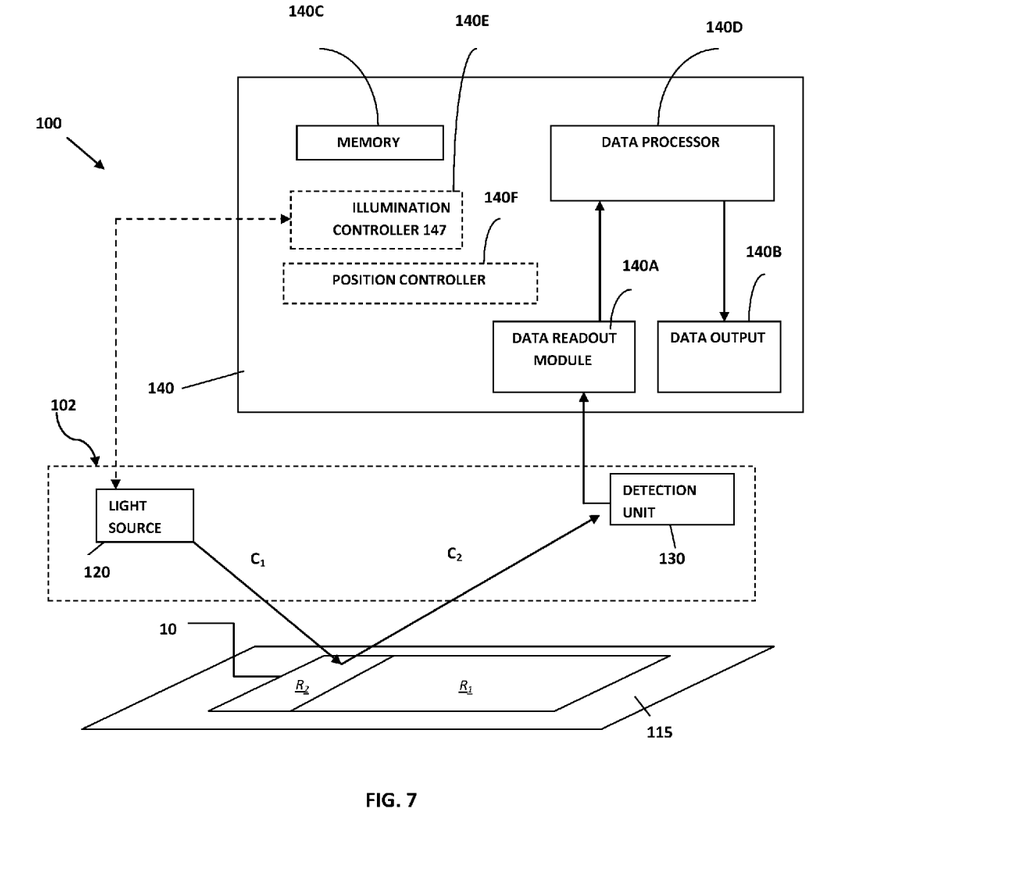
FIG. 7 is a block diagram of an optical metrology system for controlling parameters of a sample pattern by measuring in the test structure associated with the sample pattern.

As indicated above, the test structure design of the invention provides for effective metrology measurements using any known suitable design of an OCD based measurement system. Reference is made to FIG. 7 schematically illustrating a metrology system 100 suitable for such measurements on a test structure 10 associated with a sample S (e.g. semiconductor wafer). In this non-limiting example, the test structure 10 is located in a test region $R_2$ of a sample S, which is typically located on a sample holder 115. The measurement system 100 includes an optical unit 102 accommodated with respect to the sample holder 115, and connectable (via wires or wireless signal transmission) with a control unit 140.

The optical unit 102 includes illumination and detection assemblies which define an illumination channel $C_1$ and a collection/detection channel $C_2$. The illumination channel includes a light source unit 120 configured and operable to illuminate, through the illumination channel $C_1$, the test region $R_2$ in which the test structure 10 is located. The detection assembly includes a detection unit 130 configured and operable to receive light returned from the test structure and propagating along the collection/detection channel $C_2$.

The optical unit 102 may be configured to implement dark-field mode, namely to detect substantially non-zero order diffraction pattern from the test structure. To this end, any suitable light propagation scheme can be used, including masked light-path scheme. The optical unit 102 may include a polarization arrangement associated with at least the collection channel $C_2$, i.e. includes one or more polarizer filters located at least in the collection channel.

The optical unit 102 may be configured (i.e. its elements are accommodated with respect to the sample holder and with respect to one another) to orient the illumination and collection channels $C_1$ and $C_2$ such that the collection channel collects light including specular reflection from the sample 10; and/or may be configured to orient the illumination and collection channels with oblique light propagation arrangement with respect to the sample plane such that s and p polarization states can be well defined.

The control unit 140 is typically an electronic device including inter alia such software/hardware utilities/modules as data input (or data readout) module 140A and data output 140B, memory 140C, and data processor 140D. The control unit 140 may also include an illumination controller 140E and/or a position controller 140F, as well as polarization controller of polarization-based measurements are to be used.

The control unit 140 is configured to receive and process measured data provided by the detection unit 130 as will be described further below, and may be configured to operate the optical unit, e.g. to implement the desired measurement scheme. The position controller 140F may be configured for controlling a relative accommodation between the sample holder 115 and at least some elements of the optical unit 102, e.g. for providing measurements on preset or desired locations on the sample, as well as providing a desired orientation of an inspection plane, and/or relative orientation of the illumination and detection channels.

The data processor utility 140D (software utility) of the control unit 140 is adapted (preprogrammed) to analyze the detected light indicative of the optical response of split simple patterns(s) and identify whether the optical response deviates from certain nominal/reference diffraction pattern and/or directly calculate the parameter of interest and identify whether it satisfies the nominal value/range. The measured data interpretation/analysis may be model based or modeless. The measurement system may be configured to perform any known suitable OCD measurement scheme, for example as described in U.S. Pat. No. 6,657,736 assigned to the assignee of the present application.

As indicated above, the measurement system may be configured for measuring/detecting non-zero order diffraction pattern in the optical response of a test structure. This is associated with the fact that the test structure includes a "modified" test pattern which has simple pattern(s) of a relatively large pitch. This (creates, provides) gives rise to a non-zero order(s) (dark field) signal from the test structure. The suitable measured data interpretation for such measurement scheme is described in the above-indicated PCT/IL2015/050807, assigned to the assignee of the present application and incorporated herein by reference.

The following are some specific examples of the principles of the invention and how they can be practically implemented during the patterned sample manufacture using pitch division multi-patterning process. The inventors have simulated six test structures all having standard mandrel pattern and standard cut mask to define 50 microns pads, and use a block mask to completely or partially block selected spaces.

Figures 8A, 8B, 8C, 8D, 8E, 8F:
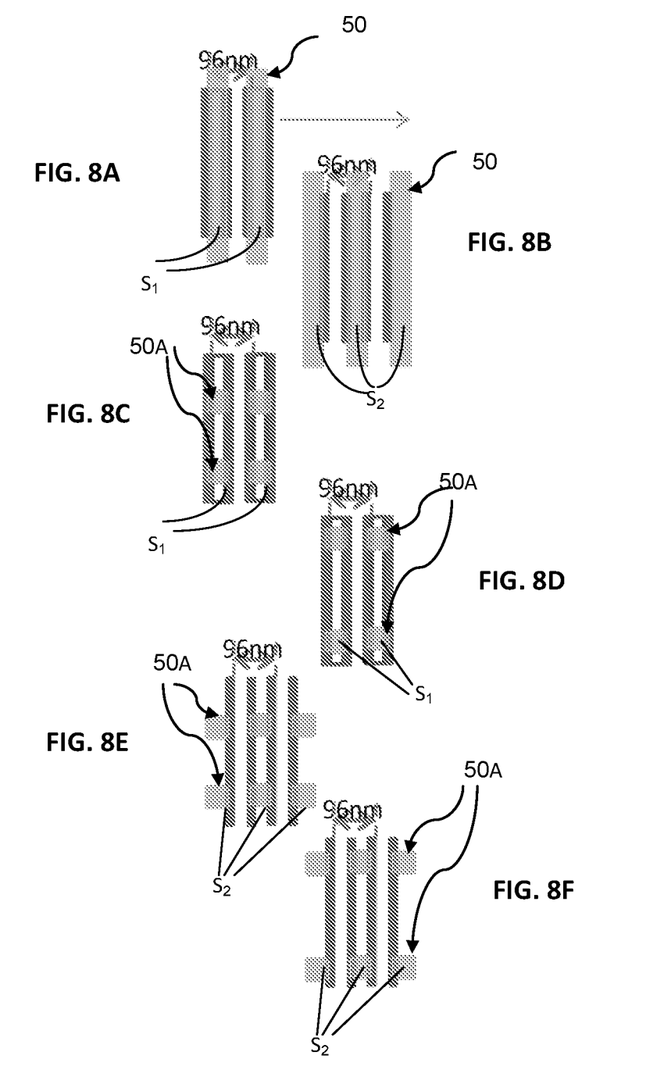
FIGS. 8A-8F exemplify test structures of four different types.

Reference is made to FIGS. 8A to 8F illustrating creation of four types of OCD test structures using various block mask designs to create desired test structure. FIG. 8A illustrates the first type structure, in which the mandrel space (space $S_1$ originated from the Core litho line center) is completely blocked with a block mask 50. FIG. 8B illustrates the second type structure in which second space $S_2$ (not Mandrel), being the trench defined by the first spacer width, is completely closed with block mask 50. FIGS. 8C and 8D illustrate the third type test structures in which mandrel space $S_1$ is partially blocked by spaced-apart block mask regions 50A creating dotted Mandrel space. FIGS. 8E and 8F illustrate the fourth type test structure in which the second space $S_2$ is partially blocked with spaced-apart block mask regions 50A.

The structures of FIGS. 8A and 8B, termed here as Block 1 and Block 2 structure, represent nominal (38 nm+20 nm) lines and 96 nm period, with exact line CD being respectively:

$CD^{(1)}_{line}$=(Mandrel+2Spacers)

$CD^{(2)}_{line}$=(Period−Mandrel).

The partially blocked structures of FIGS. 8B-8C (block 3 structure) and FIGS. 8E-8F (block 4 structure) are done with few different blocking conditions:

$CD^{(3)}_{line}$=38 nm (standard) and period 96 nm (standard)

$CD^{(4)}_{line}$=38 nm (standard) and period 2.96 nm=192 nm

Figure 9:
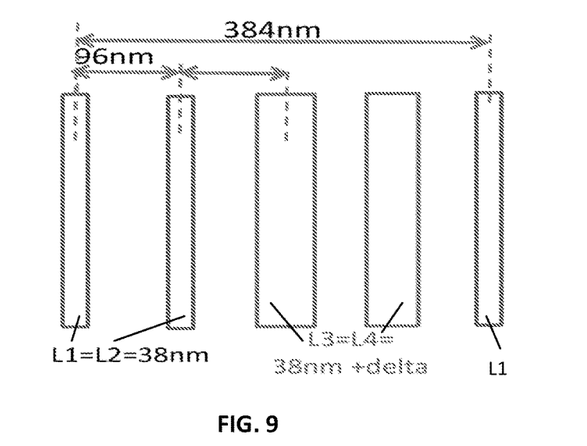
FIG. 9 exemplifies the mandrel mask design for use in manufacturing of the test structure.

FIG. 9 exemplifies the mandrel mask design, namely an example where the test structure comprises a block/cut mask (layer) associated with the mandrel (Core) pattern. As shown, the mandrel mask test structure has 2 nominal lines $L_1$ and $L_2$ with CD=38 nm and Period=96 nm and two CD lines (mask lines) with larger CDs=38 nm+delta (1-4) which are printed with total period of the structures 384 nm (96.4). The cut mask is used to create 50 micron pads. The block mask is opened.

Figure 10A:
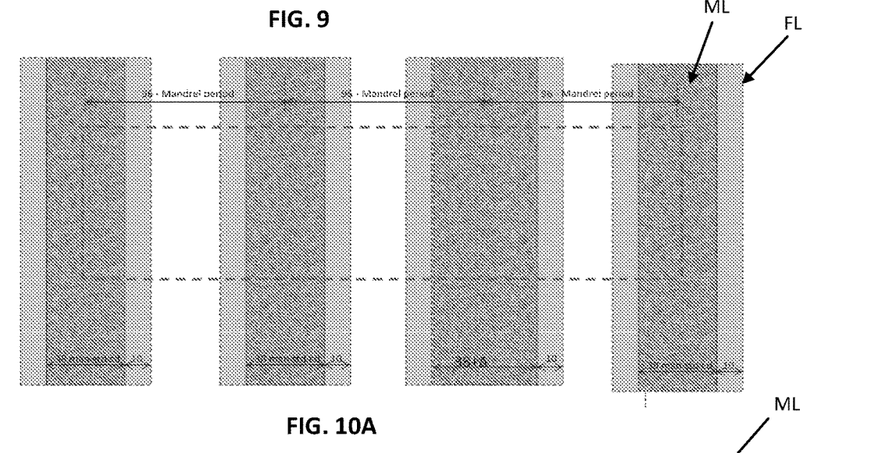
FIGS. 10A and 10B exemplify the test structures with intentionally induced difference in, respectively, the CD and the period of the sample pattern.
Figure 10B:
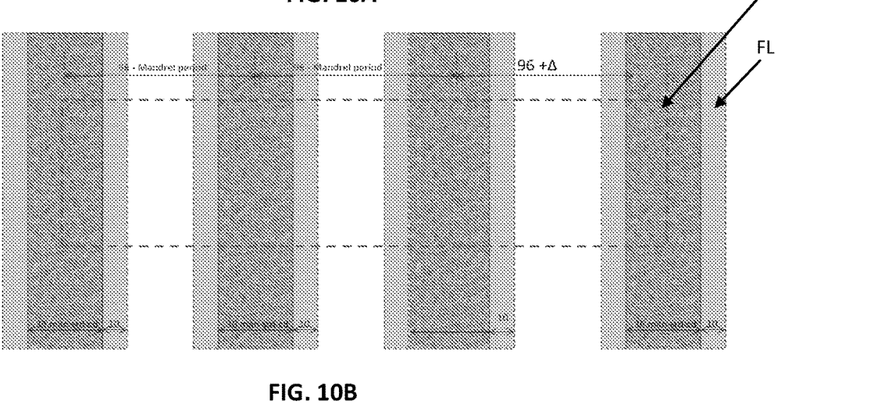

FIGS. 10A and 10B exemplify the test structures in which the intentionally induced difference in, respectively, the CD and the pattern period is used. Each of these figures shows a pattern of mandrel lines ML with respect to actual Fin lines FL. More specifically, in the example of FIG. 10A, the mandrel line CD is modified by certain Δ each $4^{th}$ and each $6^{th}$ period, and in the example of FIG. 10B, the period of mandrel pattern is modified by certain Δ each $4^{th}$ or $6^{th}$ period.

Figure 11:
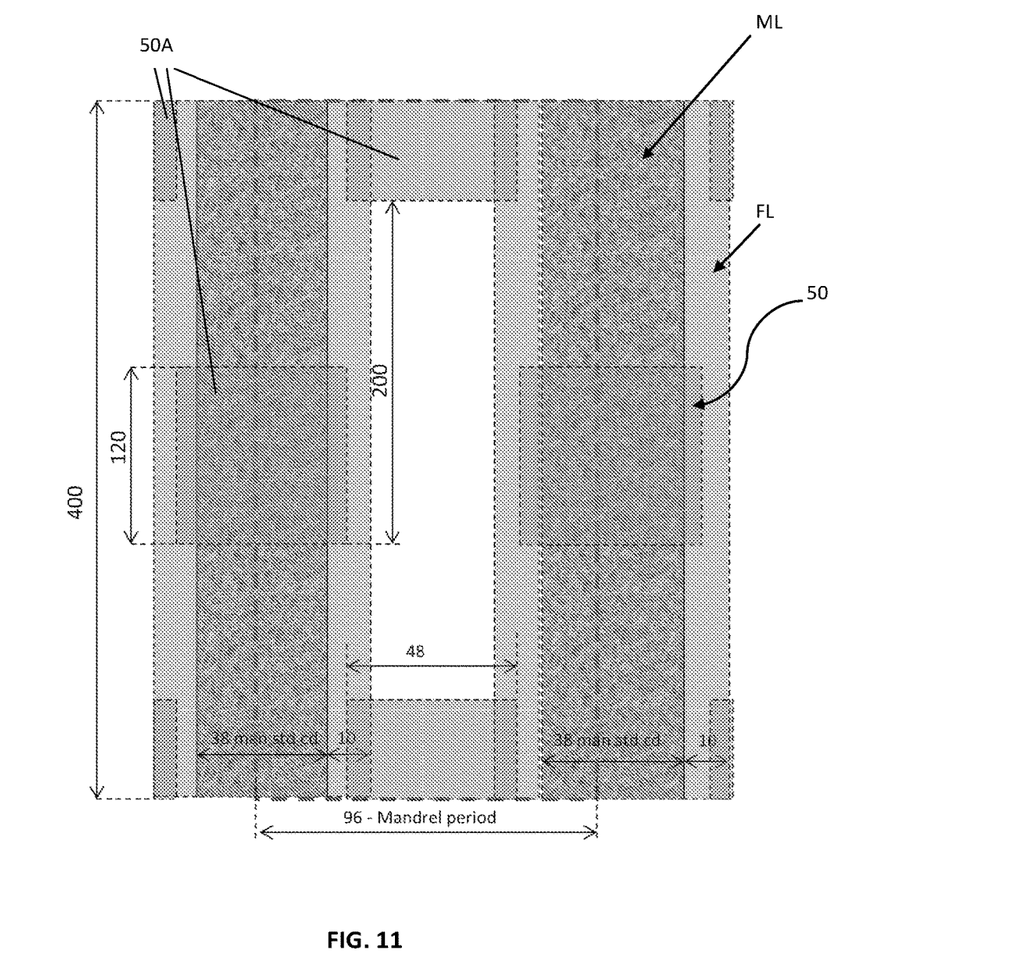
FIG. 11 exemplifies the test structure focused on a staggered block.
Figure 12:
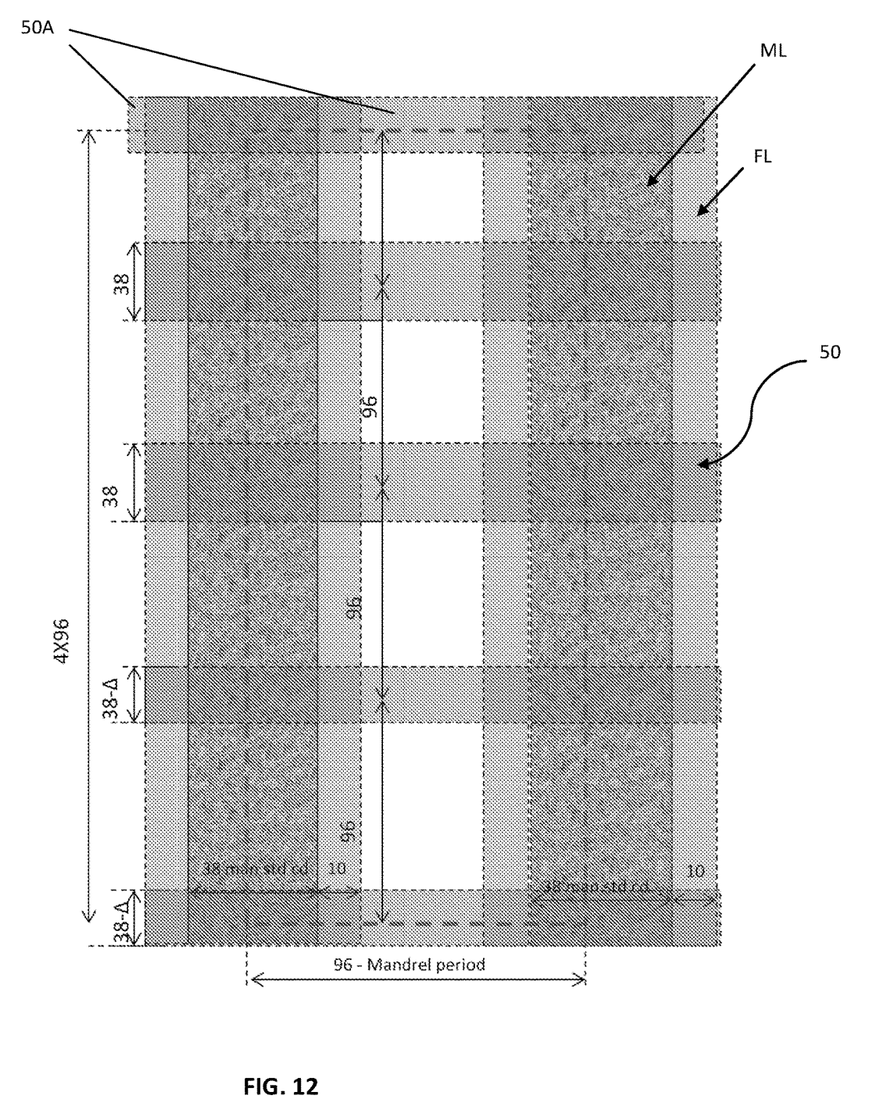
FIG. 12 illustrates a test structure utilizing a cut mask formed by spaced apart mask elements.
Figure 13:
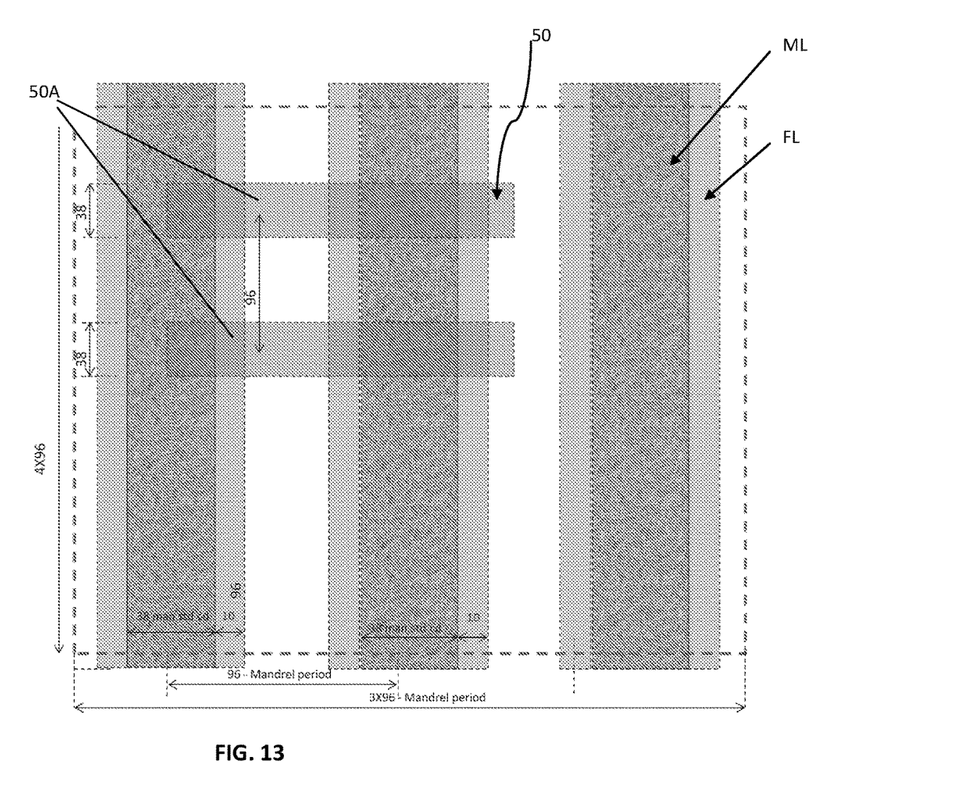
FIG. 13 illustrates the test structure utilizing two azimuth cut mask formed by mask elements.

FIG. 11 exemplifies the test structure focused on a staggered block spacer. As shown, the bock mask 50 is used formed by a plurality of spaced-apart blocking elements 50A which partially block a part of the pattern. FIG. 12 illustrates a test structure utilizing a cut mask 50 formed by spaced apart mask elements 50A. The CD of the cut mask varies from −1 to −4 nm from the nominal CD=38 nm. FIG. 13 illustrates the test structure utilizing two azimuth cut mask 50 formed by mask elements 50A.

Thus, the present invention provides a novel test structure design for use in metrology measurements of complex patterns (e.g. having small features) produced by pitch division multi-patterning process. The test structure includes a test pattern comprising a part (one or more unit cells, preferably at least two unit cells) of the sample pattern modified by a block/cut layer (either continuous or formed by spaced-apart lick/cut elements) such that some of the features of the sample pattern are covered/removed by the block/cut layer. The test pattern is manufactured together with the sample to be measured, and the test pattern is designed in accordance with the multi-patterning process used to manufacture the sample and in accordance with pattern feature(s) of the sample to be controlled (i.e. on which the control process is being focused).

The invention claimed is:

1. A method for creating a test structure for use in metrology measurements of a sample pattern produced by a predetermined multi-patterning scheme, the method comprising: applying a multi-patterning process to a test site for creating a test pattern based on design rules of the sample pattern and configured to enable focusing the metrology measurements on at least one selected feature of the sample pattern, wherein said multi-patterning process applied to the test site either comprises said multi-patterning scheme and at least one additional patterning stage or comprises said multi-patterning scheme while modifying at least one patterning stage of said multi-patterning scheme, such that said multi-patterning process creates in the test site a part of the sample pattern and at least one blocking layer at least partially blocking features of the sample pattern adjacent to said at least one selected feature.

2. The method of claim 1, wherein said at least one blocking layer comprises a continuous layer within a region between a pair of the selected features.

3. The method of claim 1, wherein said at least one blocking layer comprises blocking elements arranged in a spaced-apart regions along said at least one selected feature.

4. The method of claim 1, wherein said creating of the at least one blocking layer comprises applying material deposition on at least one region of the test structure.

5. The method of claim 1, wherein said creating of the at least one blocking layer comprises applying material removal to at least one region of the test structure.

6. The method of claim 1, wherein said multi-patterning process applied to the test site is configured to modify a complex structure of the sample pattern with respect to said at least one selected feature into the test pattern having a simpler structure with respect to said at least one selected feature.

7. The method of claim 1, wherein said test structure resulting from said multi-patterning process comprises an array of at least two spaced patterned regions, each being a portion of the unit cell of the sample pattern including, at least partially, said at least one selected feature.

8. The method of claim 1, comprising determining said multi-patterning process by processing and analyzing input data comprising: data indicative of the rule design of the sample pattern, data indicative of the multi-patterning scheme, and data indicative of said at least one selected feature on which the metrology measurements are to be focused.

9. The method of claim 1, wherein said multi-patterning process is further configured to induce a known parameter difference between the selected features in the test pattern, thereby enabling self-calibration of metrology measurements.

10. The method of claim 1, wherein said multi-patterning process is applied to the test site concurrently with applying said multi-patterning scheme to a pattern region of the sample to create the sample pattern in the pattern region.

11. The method of claim 10, wherein said multi-patterning process is applied to the test site located in a test region of the sample outside said pattern region.

12. The method of claim 10, wherein said multi-patterning process is applied to the test site located in a test region of the sample within a scribe line of the pattern region.

13. The method of claim 1, wherein the unit cell of the sample pattern comprises an array of alternating lines and spaces.

14. The method of claim 1, wherein the multi-patterning scheme includes at least one of Litho-Etch-Litho-Etch (LELE) scheme, Spacer Assisted Double Patterning (SADP) scheme, and Spacer Assisted Quadra Patterning (SADP) scheme.

15. A test structure for use in metrology measurements of a sample pattern, the test structure being created by the method of claim 1.

16. A test structure for use in metrology measurements of a sample pattern, the test structure comprising a test pattern comprising a portion of the sample pattern including at least one selected feature of the sample pattern and a blocking layer at least partially covering regions of the test structure adjacent to said at least one selected region.

17. The method of claim 1, wherein said multi-patterning process applied to the test site is configured to modify a complex structure of the sample pattern with respect to said at least one selected feature into the test pattern having a simpler structure with respect to said at least one selected feature, the test pattern comprising an array of at least two spaced patterned regions, each being a portion of the unit cell of the sample pattern including, at least partially, said at least one selected feature.

18. A sample comprising a pattern region having a sample pattern and a test site comprising a test structure having a test pattern, wherein the test structure is created by the method of claim 1, such that the multi-patterning process is applied to the test site concurrently with applying the multi-patterning scheme to the pattern region of the sample to create the sample pattern in the pattern region, the test site having one of the following configurations: the test site is located in a test region of the sample outside said pattern region; or the test site is located in a test region of the sample within a scribe line of the pattern region.

* * * * *